United States Patent
Ishizuka

(10) Patent No.: US 10,057,993 B2
(45) Date of Patent: Aug. 21, 2018

(54) MANUFACTURING METHOD OF POWER-MODULE SUBSTRATE

(71) Applicant: MITSUBISHI MATERIALS CORPORATION, Tokyo (JP)

(72) Inventor: Hiroya Ishizuka, Kitamoto (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 63 days.

(21) Appl. No.: 14/652,554

(22) PCT Filed: Dec. 3, 2013

(86) PCT No.: PCT/JP2013/082449
§ 371 (c)(1),
(2) Date: Jun. 16, 2015

(87) PCT Pub. No.: WO2014/097880
PCT Pub. Date: Jun. 26, 2014

(65) Prior Publication Data
US 2015/0289385 A1    Oct. 8, 2015

(30) Foreign Application Priority Data

Dec. 17, 2012  (JP) ................................. 2012-275157

(51) Int. Cl.
*B23K 1/00*   (2006.01)
*H05K 3/20*   (2006.01)
(Continued)

(52) U.S. Cl.
CPC ............. *H05K 3/20* (2013.01); *B23K 1/0016* (2013.01); *B23K 1/19* (2013.01); *C04B 37/026* (2013.01);
(Continued)

(58) Field of Classification Search
None
See application file for complete search history.

(56) References Cited

U.S. PATENT DOCUMENTS

| 4,540,462 A * | 9/1985 | Mizunoya | H01L 21/48 |
| | | | 156/308.2 |
| 2002/0060091 A1* | 5/2002 | Naba | H01L 23/15 |
| | | | 174/257 |

(Continued)

FOREIGN PATENT DOCUMENTS

| EP | 1119227 A1 | 7/2001 |
| JP | 04-160071 A | 6/1992 |

(Continued)

OTHER PUBLICATIONS

Supplementary European Search Report dated Apr. 25, 2016, issued for the European patent application No. 13865283.9.

(Continued)

*Primary Examiner* — Devang R Patel
(74) *Attorney, Agent, or Firm* — Locke Lord LLP; James E. Armstrong, IV; Nicholas J. DiCeglie, Jr.

(57) ABSTRACT

A manufacturing method of power-module substrate (10), the power-module substrate (10) being obtained by joining a circuit layer (12) made of copper to one surface of a ceramic substrate (11) and joining a heat-radiation layer (13) made of aluminum to the other surface of the ceramic substrate (11), including: a circuit layer bonding step in which the circuit layer (12) is brazed on the ceramic substrate (11), a surface treatment step after the circuit layer bonding step in which a thickness of an oxide film on the other surface of the ceramic substrate (11) is made 3.2 nm or less at least at a peripheral part of an intended bonding area between the ceramic substrate (11) and the heat-radiation layer (13), and a heat-radiation layer bonding step in (Continued)

which the heat-radiation layer (13) is brazed on the other surface of the ceramic substrate (11) after the surface treatment step.

17 Claims, 4 Drawing Sheets

(51) Int. Cl.
 *H01L 23/373* (2006.01)
 *H01L 21/48* (2006.01)
 *C04B 37/02* (2006.01)
 *B23K 1/19* (2006.01)

(52) U.S. Cl.
 CPC ...... *H01L 21/4871* (2013.01); *H01L 23/3735* (2013.01); *C04B 2237/121* (2013.01); *C04B 2237/128* (2013.01); *C04B 2237/365* (2013.01); *C04B 2237/366* (2013.01); *C04B 2237/402* (2013.01); *C04B 2237/407* (2013.01); *C04B 2237/52* (2013.01); *C04B 2237/704* (2013.01); *H01L 2924/0002* (2013.01); *H05K 2203/04* (2013.01)

(56) References Cited

U.S. PATENT DOCUMENTS

| | | | | |
|---|---|---|---|---|
| 2004/0074951 | A1* | 4/2004 | Takahashi | B32B 15/04 228/219 |
| 2004/0149689 | A1* | 8/2004 | Ning | H01L 21/4875 216/83 |
| 2010/0258233 | A1* | 10/2010 | Tonomura | H01L 21/4807 156/64 |
| 2011/0067906 | A1* | 3/2011 | Kuromitsu | H01L 23/3735 174/255 |
| 2011/0074010 | A1* | 3/2011 | Kuromitsu | H01L 23/3735 257/703 |
| 2012/0305281 | A1* | 12/2012 | Knoll | H01L 21/4846 174/50 |

FOREIGN PATENT DOCUMENTS

| | | | |
|---|---|---|---|
| JP | 05-275559 A | | 10/1993 |
| JP | 2001-135902 A | | 5/2001 |
| JP | 2001135902 A | * | 5/2001 |
| JP | 2003-007939 A | | 1/2003 |
| JP | 2003-197826 A | | 7/2003 |

OTHER PUBLICATIONS

International Search Report dated Mar. 4, 2014, issued for PCT/JP2013/082449.

* cited by examiner

MANUFACTURING METHOD OF POWER-MODULE SUBSTRATE

BACKGROUND OF THE INVENTION

Field of the Invention

The present invention relates to a manufacturing method of a power-module substrate for a semiconductor device controlling a large electric current and high voltage.

Priority is claimed on Japanese Patent Application No. 2012-275157, filed Dec. 17, 2012, the content of which is incorporated herein by reference.

Description of the Related Art

Conventionally, it is known that a power-module substrate has a structure in which a metal plate is laminated to form a circuit layer on one surface of a ceramic substrate, and a metal plate is laminated to form a heat-radiation layer on the other surface of the ceramic substrate. Electronic components such as a semiconductor chip and the like is soldered on the circuit layer; and a heat sink is bonded on the heat-radiation layer.

In power-module substrates of this kind, there is a case in which the metal plate forming the circuit layer is made of copper having an excellent electrical characteristic, and the metal plate forming the heat-radiation layer is made of aluminum in order to buffer thermal stress with respect to the ceramic substrate.

For example, Patent Document 1 discloses a circuit substrate in which a copper plate is bonded on one surface of a ceramic substrate and an aluminum plate is bonded on the other surface. In this case, the ceramic substrate and the copper plate are bonded to each other by brazing material of reactive metal; and the ceramic substrate and the aluminum plate are bonded to each other by Al—Si based brazing material. In a case in which Ag—Cu—Ti based reactive-metal brazing material is used, bonding temperature is 800 to 930° C. Bonding temperature by the Al—Si based brazing material is 500 to 650° C.

PRIOR ART DOCUMENT

Patent Document

Patent Document 1: Japanese Unexamined Patent Application, First Publication No. 2003-197826

SUMMARY OF THE INVENTION

Problems to be Solved by the Invention

As described in Patent Document 1, when the ceramic substrate and the copper plate are bonded to each other by brazing using the reactive metal, since they are bonded at 800 to 930° C., an oxide film is formed on the other surface of the ceramic substrate. Even if the heat-radiation layer is brazed in the state in which the oxide film is formed, there is a possibility of separation at a bonded interface between the ceramic substrate and the heat-radiation layer owing to the oxide film.

In the bonding interface between the ceramic substrate and the heat-radiation layer, there is a possibility that the separation is spread particularly at a peripheral part in which the largest thermal stress is applied. Moreover, in a case in which the heat-radiation layer and the heat sink are brazed by flux, since the flux has an effect of removing the oxide film and erodes the oxide film at the peripheral part of the bonded interface between the ceramic substrate and the heat-radiation layer, there is a problem in which the separation of the bonding interface between the ceramic substrate and the heat-radiation layer is further progressed.

The present invention is achieved in consideration of the above circumstances, and has an object to prevent a separation of a ceramic substrate and a heat-radiation layer especially when a heat sink is bonded.

Means for Solving the Problem

A manufacturing method of a power-module substrate according to the present invention includes: a circuit layer bonding step in which a circuit layer made of copper is brazed on one surface of a ceramic substrate; a heat-radiation layer bonding step in which a heat-radiation layer made of aluminum is brazed on the other surface of the ceramic substrate; and a surface treatment step after the circuit layer bonding step and before the heat-radiation layer bonding step, in which a thickness of an oxide film on the other surface of the ceramic substrate is made 3.2 nm or less at least at a peripheral part of an intended bonding area between the ceramic substrate and the heat-radiation layer, in which a power-module substrate is manufactured so as to have: the ceramic substrate; the circuit layer bonded on the one surface of the ceramic substrate; and the heat-radiation layer bonded on the other surface of the ceramic substrate.

According to the present invention, the thickness of the oxide film is made 3.2 nm or less at the peripheral part of the intended bonding area between the ceramic substrate and the heat-radiation layer before the heat-radiation layer is bonded; so that a separation at a bonding interface of the ceramic substrate and the heat-radiation layer can be prevented. Furthermore, in a case in which the brazing is performed by using flux, it is possible to prevent erosion of the bonded interface of the flux between the ceramic substrate and the heat-radiation layer.

In the manufacturing method of power-module substrate according to the present invention, it is preferable that in the surface treatment step, the other surface of the ceramic substrate be cleaned by one or more acids selected from hydrochloric acid, nitric acid, and sulfuric acid.

When the surface of the ceramic substrate is cleaned, the ceramic substrate is eroded if alkali is used. Moreover, stress remains at a surface region if mechanical treatment such as blasting is performed, and causes cracks and the like. Among the acids, hydrochloric acid is especially suitable for the surface treatment for removing the oxide film because oxidative effect of the hydrochloric acid is weak; and even if the hydrochloric acid touches the circuit layer, the circuit layer is not eroded.

Effects of the Invention

According to the manufacturing method of power-module substrate of the present invention, after bonding the circuit layer to the ceramic substrate by a high-temperature heating treatment, the surface treatment is performed on the ceramic substrate so that the oxide film on the surface is thinner than a prescribed thickness, and then the heat-radiation layer is bonded: accordingly, it is possible to manufacture a power-module substrate having high bonding reliability at the bonding interface of the ceramic substrate and the heat-radiation layer.

DETAILED DESCRIPTION OF THE INVENTION

Below, an embodiment of a manufacturing method of power-module substrate according to the present invention will be described.

Figure 2:
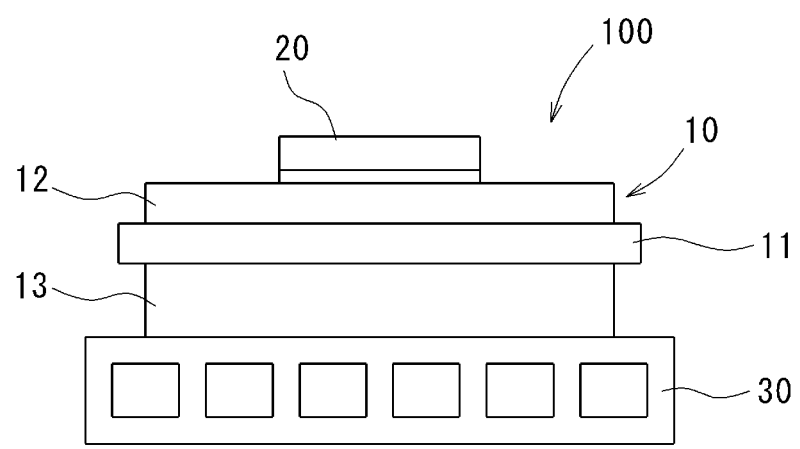
FIG. 2 is a sectional view showing a power module manufactured by the manufacturing method according to the present invention.

A power module 100 illustrated in FIG. 2 is configured from a power-module substrate 10, an electronic component 20 such as a semiconductor chip and the like mounted on a front surface of the power-module substrate 10, and a heat sink 30 bonded on a back surface of the power-module substrate 10.

In the power-module substrate 10, a circuit layer 12 is laminated in a thickness direction on one surface (i.e., a circuit-layer surface) of a ceramic substrate 11; and a heat-radiation layer 13 is laminated in the thickness direction on the other surface (i.e., a heat-radiation layer surface) of the ceramic substrate 11, and the layers are bonded to the ceramic substrate 11.

The ceramic substrate 11 is made of aluminum nitride (AlN), silicon carbide (SiC) or the like to have a thickness of 0.32 mm to 1.0 mm for example. The circuit layer 12 is made of pure copper such as oxygen-free copper, tough-pitch copper or the like or copper alloy. The heat-radiation layer 13 is made of pure aluminum having purity of 99.00% or more or aluminum alloy. Thicknesses of the circuit layer 12 and the heat-radiation layer 13 are 0.25 mm to 2.5 mm for example.

The power-module substrate 10 of the present embodiment is configured from, as a desirable combination for example, the ceramic substrate 11 made of AlN having a thickness of 0.635 mm, the circuit layer 12 made of pure copper plate having a thickness of 0.6 mm, and the heat-radiation layer 13 made of 4N-aluminum plate having a thickness of 1.6 mm.

Bonding processes of the ceramic substrate 11, the circuit layer 12, and the heat-radiation layer 13 are divided in 2 parts as under-mentioned. That is to say, the circuit layer 12 is bonded on the circuit-layer surface of the ceramic substrate 11 at first; and then the heat-radiation layer 13 is bonded on the heat-radiation layer surface of the ceramic substrate 11. In this case, for example, reactive-metal brazing-material of Ag-27.4% by mass of Cu-2.0% by mass of Ti is used for bonding the ceramic substrate 11 and the circuit layer 12. For example, Al—Si based brazing material or Al—Ge based brazing material is used for bonding the ceramic substrate 11 and the heat-radiation layer 13.

Figure 1:
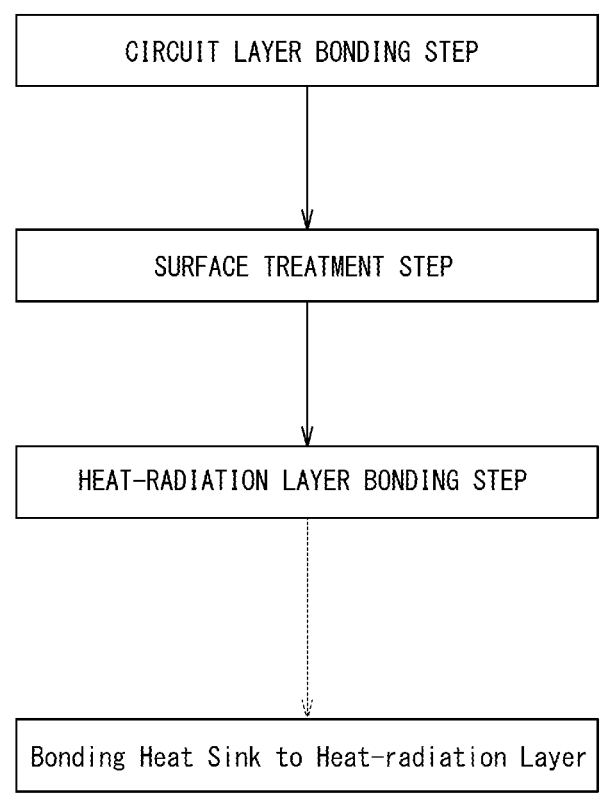
FIG. 1 is a flow chart showing a manufacturing method of power-module substrate according to the present invention.

Next, a manufacturing method of the power-module substrate 10 configured above will be described. A flow chart thereof is shown in FIG. 1.

As described above, the circuit layer 12 is bonded on the circuit-layer surface of the ceramic substrate 11 at first (a circuit layer bonding step), and then the heat-radiation layer 13 is bonded on the heat-radiation layer surface of the ceramic substrate 11 (a heat-radiation layer bonding step). After bonding the circuit layer 12 and before bonding the heat-radiation layer 13, a surface treatment is performed on the surface (the heat-radiation layer surface) of the ceramic substrate 11 on which the the circuit layer 12 is not bonded (a surface treatment step). Then, the heat sink 30 is bonded on the heat-radiation layer 13. Below, these steps will be described in sequence.

(Circuit-layer Bonding Step)

Figure 3:
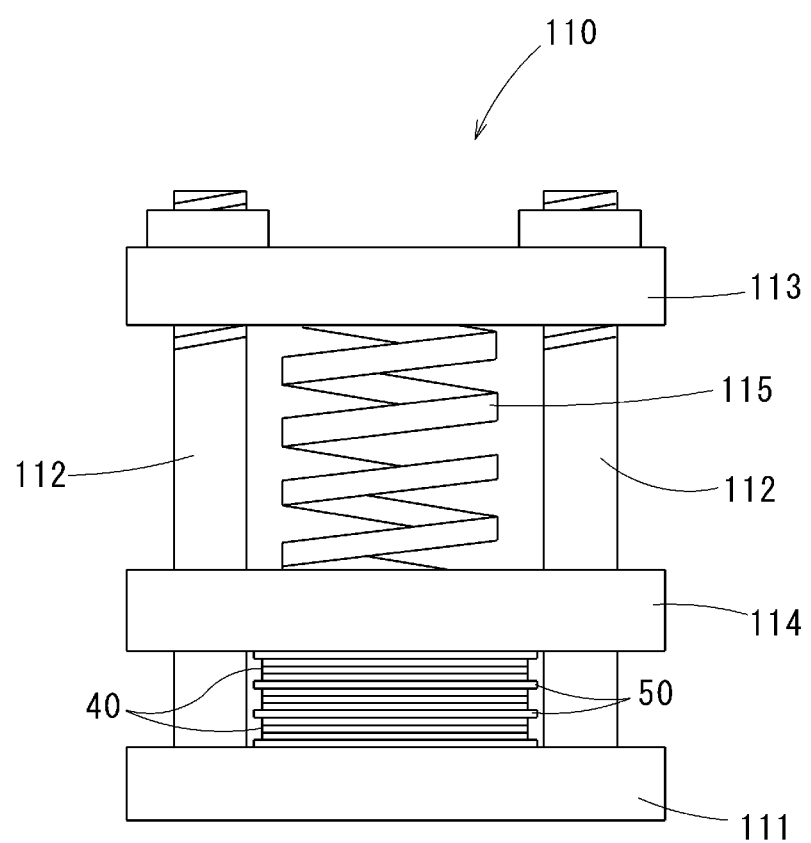
FIG. 3 is a side view showing an example of a pressurizing device used for the manufacturing method according to the present invention.

The circuit layer 12 is laminated on the one surface (the circuit-layer surface) of the ceramic substrate 11 with the paste-like or foil-like reactive-metal brazing-material therebetween, so that one of stack bodies 40 is formed. The stack bodies 40 are piled with plate-like cushion sheets 50 (made of carbon graphite or the like) therebetween, and pressurized by a pressurizing device 110 as shown in FIG. 3 in a stacking direction with 0.3 MPa to 1.0 MPa for example.

The pressurizing device 110 includes a base plate 111, guide posts 112 vertically installed at four corners of the base plate 111 on an upper surface, a fixed plate 113 fixed on upper ends of the guide posts 112, a pressurizing plate 114 upward and downward movably held by the guide posts 112 between the base plate 111 and the fixed plate 113, and a pressing means 115 such as a spring or the like provided between the fixed plate 113 and the pressurizing plate 114 so as to press the pressurizing plate 114 downward. The above mentioned stack bodies 40 and the cushion sheets 50 are arranged between the base plate 111 and the pressurizing plate 114.

In a state in which the stack bodies 40 are pressurized in the pressurizing device 110, the stack bodies 40 are heated together with the pressurizing device 110 arranged in a heating furnace (not illustrated) in vacuum atmosphere, at temperature of 800° C. or higher and 930° C. or lower, for 1 minute to 60 minutes: so that the ceramic substrate 11 and the circuit layer 12 are brazed.

This brazing is a bonding process using the reactive-metal brazing-material. Ti in the brazing material, which is the reactive metal, is preferentially spread to the ceramic substrate 11 and forms a Ti compound: so that the circuit layer 12 and the ceramic substrate 11 are bonded with Ag—Cu alloy.

(Surface Treatment Step)

While the circuit-layer bonding step, since the counter surface (the heat-radiation layer surface) to the circuit-layer 12 of the ceramic substrate 11 is also exposed to high temperature, an oxide film is generated on the surface. In the surface treatment step, the oxide film generated on the ceramic substrate 11 is reduced.

By cleansing the heat-radiation layer surface of the ceramic substrate 11 by acid, the oxide film is reduced. As acid for cleansing, one or more selected from hydrochloric acid, nitric acid, and sulfuric acid is used. Especially, hydrochloric acid is desirable since an oxidative effect is weak; 18% by mass of hydrochloric acid is used, for example.

Specifically, after being soaked in 18% hydrochloric acid for 5 minutes, the ceramic substrate 11 to which the circuit layer 12 is bonded is drawn up, and cleansed by distilled water in order to remove acid on the surface. And then, furthermore, after being soaked in alcohols, the ceramic substrate 11 with the circuit layer 12 is dried. As the alcohols, ethanol can be used for example.

In a case in which nitric acid is used for this surface treatment, it is also possible to spray nitric acid to the heat-radiation layer surface of the ceramic substrate 11 instead of to soak. Accordingly, erosion of the circuit layer 12 resulting from the nitric acid can be prevented.

By this surface treatment, the thickness of the oxide film on the heat-radiation layer surface of the ceramic substrate 11 is reduced to 3.2 nm or less at least at a peripheral part of an intended bonding area of the ceramic substrate 11 and the heat-radiation layer 13. As described below, if erosion by flux is occurred while brazing the heat sink 30, an outer peripheral part of a bonding interface between the ceramic substrate 11 and the circuit layer 12 is eroded away: accordingly, it is important to reduce the thickness of the oxide film to be less than a prescribed value at the outer peripheral part of the bonding interface. Here, the peripheral part in which the thickness of the oxide film to be regulated is at a position of, for example, 1 mm from a peripheral edge of the intended bonding area between the ceramic substrate 11 and the circuit layer 12. The thickness of the oxide film can be measured from an analysis result of a surface state by an X-ray photoelectron spectroscopy (XPS) or the like.

(Heat-radiation Layer Bonding Step)

After the surface treatment, the heat-radiation layer 13 is laminated on the heat-radiation layer surface of the ceramic substrate 11 with brazing material therebetween so as to form a laminate body; a plurality of the stack bodies 40 are piled between the cushion sheets 50 and pressed in a laminating direction by the pressurizing device 110 in, for example, 0.3 MPa to 1.0 MPa (not illustrated).

Then, the stack bodies 40 are arranged in the heating furnace (not illustrated) together with the pressurizing device 110 in a state of being pressed in the pressurizing device 110, and heated in vacuum atmosphere at temperature of 630° C. or higher and 650° C. or lower for 1 minute to 60 minutes; so that the ceramic substrates 11 and the heat-radiation layers 13 are brazed, and the power-module substrates 10 are manufactured.

In the power-module substrate 10 manufactured as above, the oxide film which is generated on the surface of the ceramic substrate 11 while the circuit layer bonding step is reduced by the surface treatment step, and then the heat-radiation layer bonding step is performed. Therefore, the oxide film at the bonding interface between the ceramic substrate 11 and the heat-radiation layer 13 is extremely reduced; and a bonding reliability can be improved at the bonding interface between the ceramic substrate 11 and the heat-radiation layer 13.

Although it is desirable that the thickness of the oxide film be reduced on the entire surface of the ceramic substrate 11 in the surface treatment step, since there is the possibility that the separation is occurred at the outer peripheral part in which heat stress is largest among the bonded interface of the ceramic substrate 11 and the heat-radiation layer 13, it is adequate that at least at the outer peripheral part of the intended bonding area of the ceramic substrate 11 and the heat-radiation layer 13, the thickness of the oxide film be reduced to 3.2 nm or less.

EXAMPLES

Experimentation was performed in order to confirm the effectiveness of the above described manufacturing method of the power-module substrate.

First, as samples "a" to "g", ceramic substrates made of AlN of 30 mm square were prepared. Supposing the reactive-metal brazing, the heat treatment was performed on the ceramic substrates of the samples "b" to "g" among these samples at temperature of 860° C. for 30 minutes. The surface treatment by acid was performed as bellow on the samples "c" to "g" among the samples "b" to "g" which were heat-treated. The thicknesses of the oxide films in the samples "a" to "g" were measured after the treatments.

a: No heat treatment was performed.
b: Only the heat treatment was performed.
c: After the heat treatment, it was soaked in 18% by mass of hydrochloric acid for 2.5 minutes
d: After the heat treatment, it was soaked in 18% by mass of hydrochloric acid for 5 minutes
e: After the heat treatment, it was soaked in 18% by mass of hydrochloric acid for 10 minutes
f: After the heat treatment, it was soaked in 30% by mass of nitric acid aqueous solution for 5 minutes
g: After the heat treatment, it was soaked in 14% by mass of sulfuric acid aqueous solution for 5 minutes The thicknesses of the oxide films were measured by an XPS analysis. Conditions of the analysis were below.

Figure 4:
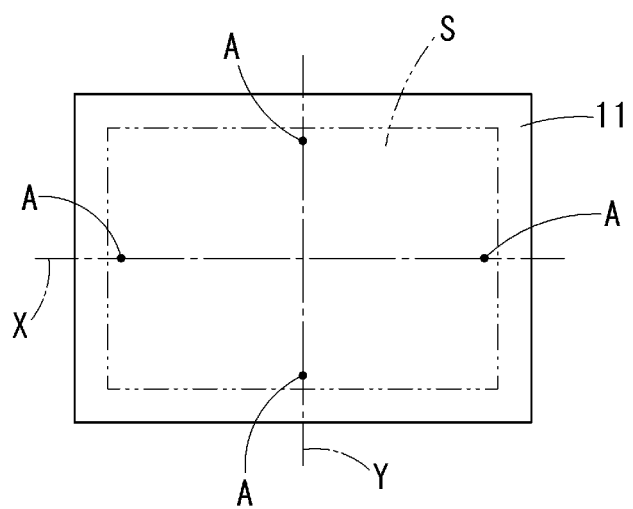
FIG. 4 is a front view showing measured points of a thickness of an oxide film.

X-ray Source: Standard AlKα 350 W
Pass Energy: 187.85 eV (Survey), 58.5 eV (Depth)
Measuring Interval: 0.8 eV/step (Survey), 0.125 eV (Depth)
Take-off Angle of Photoelectron to a surface of the sample: 45 deg
Analysis Area: about 800 μm in diameter
Sputter Rate: 1.6 nm/min A range in which oxygen-peak area measured by the XPS analysis was a half of an initial value was supposed to be the oxide film; and a thickness of the oxide film was calculated from a sputtering time and the sputter rate. As shown in FIG. 4, a thickness of the oxide film was measured at four point of marks A on an X-axis and a Y-axis passing through a center of an intended bonding area S and of 1 mm inside from a peripheral edge of the intended bonding area S of the heat-radiation layer 13 (a 4N-aluminum plate) to the ceramic substrate 11; and an average thereof was the thickness of the oxide film in the samples "a" to "g" (refer to Table 1).

Next, in the samples "b" to "g" after the surface treatment, a 4N-aluminum plate simulating the heat-radiation layer 13 was bonded to the surface of the ceramic substrate using Al—Si based brazing material. To this 4N-aluminum plate, an aluminum-alloy plate simulating the heat sink 30 is brazed using flux; and the bondability between the ceramic substrate and the 4N-aluminum plate was evaluated in the samples "b" to "g".

As the "bondability", a bonding state of the ceramic plate and the aluminum plate was evaluated using ultrasonic test equipment. From a calculation formula of "bonding rate"= ("intended bonding size"−"non-bonded size")/"intended bonding size" the bonding rate was obtained, ones having the bonding rate of 85% or higher were evaluated as "good"; or ones having the bonding rate of lower than 85% were evaluated as "poor". The non-bonded part appears as a white part in an ultrasonic test image picturing the bonded surface by the ultrasonic test equipment. Accordingly, the non-bonded size was obtained by measuring the size of the white part in the intended bonding area S. Moreover, the intended bonding size was a size of the intended bonding area S, i.e., the size of the aluminum plate. TABLE 1 shows the evaluation result of the bondability.

TABLE 1

|  | a | b | c | d | e | f | g |
|---|---|---|---|---|---|---|---|
| THICKNESS OF OXIDE FILM | 2.1 | 3.8 | 3 | 2.9 | 2.9 | 3.2 | 2.4 |
| BONDABILITY | — | POOR | GOOD | GOOD | GOOD | GOOD | GOOD |

Comparing the sample "a" and the sample "b", it is found that the thickness of the oxide film at the surface of the ceramic substrate was increased by the heat treatment.

Furthermore, comparing the sample "a" and the sample "b", the thickness of the oxide film was reduced in the samples "c" to "g" by the surface treatment by acid. With respect to the samples "c" to "g" in which the thickness of the oxide film was reduced to 3.2 nm or less by the surface treatment, excellent bondability was obtained. It was found that the excellent bondability can be obtained by reducing the oxide film at the outer peripheral part since almost of the non-bonded part is limited to the outer peripheral part of the bonding interface.

The present invention is not limited to the above-described embodiments and various modifications may be made without departing from the scope of the present invention.

INDUSTRIAL APPLICABILITY

In manufacturing of a power-module substrate, to prevent a separation of a ceramic substrate and a heat-radiation layer especially when bonding a heat sink.

DESCRIPTION OF REFERENCE SYMBOLS 10 power-module substrate
11 ceramic substrate
12 circuit layer
13 heat-radiation layer
20 electronic component
30 heat sink
40 stack body
50 cushion sheet
110 pressurizing device
111 base plate
112 guide post
113 fixed plate
114 pressurizing plate
115 pressing means

What is claimed is:

1. A manufacturing method of power-module substrate, comprising:
a circuit layer bonding step in which a circuit layer made of copper is brazed on one surface of a ceramic substrate made of aluminum nitride in vacuum atmosphere at a temperature of 800° C. or higher and 930° C. or lower;
a heat-radiation layer bonding step in which a heat-radiation layer made of aluminum is brazed on the other surface of the ceramic substrate;
a heat sink brazing step in which a heat sink is brazed on the heat-radiation layer using flux; and
a surface treatment step after the circuit layer bonding step and before the heat-radiation layer bonding step, in which a thickness of an oxide film on the other surface of the ceramic substrate is made 3.2 nm or less and 2.4 nm or more by cleaning the other surface of the ceramic substrate by one or more acids selected from hydrochloric acid, nitric acid, and sulfuric acid at least at a peripheral part of an intended bonding area between the ceramic substrate and the heat-radiation layer, wherein
a power-module substrate is manufactured so as to have: the ceramic substrate; the circuit layer bonded on the one surface of the ceramic substrate; and the heat-radiation layer bonded on the other surface of the ceramic substrate.

2. The manufacturing method of power-module substrate according to claim 1, wherein the peripheral part is at a position of 1 mm from a peripheral edge of the intended bonding area.

3. The manufacturing method of power-module substrate according to claim 1, wherein the heat-radiation layer bonding step is performed in vacuum atmosphere.

4. The manufacturing method of power-module substrate according to claim 1, wherein the heat-radiation layer bonding step is performed at temperature of 630° C. or higher and 650° C. or lower.

5. The manufacturing method of power-module substrate according to claim 3, wherein the heat-radiation layer bonding step is performed at temperature of 630° C. or higher and 650° C. or lower.

6. The manufacturing method of power-module substrate according to claim 1, wherein the ceramic substrate has a thickness of 0.32 mm to 1.0 mm.

7. The manufacturing method of power-module substrate according to claim 1, wherein the circuit layer has a thickness of 0.25 mm to 2.5 mm.

8. The manufacturing method of power-module substrate according to claim 1, wherein the heat-radiation layer has a thickness of 0.25 mm to 2.5 mm.

9. The manufacturing method of power-module substrate according to claim 1, wherein the surface treatment step is performed by soaking the ceramic substrate in hydrochloric acid.

10. The manufacturing method of power-module substrate according to claim 1, wherein the surface treatment step is performed by spraying the ceramic substrate with nitric acid.

11. A manufacturing method of power-module substrate, comprising:
a circuit layer bonding step in which a circuit layer made of copper is brazed on one surface of a ceramic substrate made of aluminum nitride in vacuum atmosphere at a temperature of 800° C. or higher and 930° C. or lower;
a heat-radiation layer bonding step in which a heat-radiation layer made of aluminum is brazed on the other surface of the ceramic substrate in vacuum atmosphere at a temperature of 630° C. or higher and 650° C. or lower;
a heat sink brazing step in which a heat sink is brazed on the heat-radiation layer using flux; and
a surface treatment step after the circuit layer bonding step and before the heat-radiation layer bonding step, in which a thickness of an oxide film on the other surface of the ceramic substrate is made 3.2 nm or less and 2.4 nm or more by cleaning the other surface of the ceramic substrate by one or more acids selected from hydrochloric acid, nitric acid, and sulfuric acid at least at a peripheral part of an intended bonding area between the ceramic substrate and the heat-radiation layer, wherein
a power-module substrate is manufactured so as to have: the ceramic substrate; the circuit layer bonded on the one surface of the ceramic substrate; and the heat-radiation layer bonded on the other surface of the ceramic substrate.

12. The manufacturing method of power-module substrate according to claim 11, wherein the peripheral part is at a position of 1 mm from a peripheral edge of the intended bonding area.

13. The manufacturing method of power-module substrate according to claim 11, wherein the ceramic substrate has a thickness of 0.32 mm to 1.0 mm.

14. The manufacturing method of power-module substrate according to claim 11, wherein the circuit layer has a thickness of 0.25 mm to 2.5 mm.

15. The manufacturing method of power-module substrate according to claim 11, wherein the heat-radiation layer has a thickness of 0.25 mm to 2.5 mm.

16. The manufacturing method of power-module substrate according to claim 11, wherein the surface treatment step is performed by soaking the ceramic substrate in hydrochloric acid.

17. The manufacturing method of power-module substrate according to claim 11, wherein the surface treatment step is performed by spraying the ceramic substrate with nitric acid.

\* \* \* \* \*